United States Patent
Ishio et al.

[11] Patent Number: 6,118,184
[45] Date of Patent: *Sep. 12, 2000

[54] SEMICONDUCTOR DEVICE SEALED WITH A SEALING RESIN AND INCLUDING STRUCTURE TO BALANCE SEALING RESIN FLOW

[75] Inventors: Toshiya Ishio, Nara; Hiroyuki Nakanishi, Kitakatsuragi-gun; Katsunobu Mori, Nara; Katsuyuki Tarui, Kasaoka, all of Japan

[73] Assignee: Sharp Kabushiki Kaisha, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/108,806

[22] Filed: Jul. 1, 1998

[30] Foreign Application Priority Data

Jul. 18, 1997 [JP] Japan .................................. 9-194493

[51] Int. Cl.⁷ .......................... H01L 23/28; H01L 23/495; H01L 21/60; H01L 23/48
[52] U.S. Cl. .......................... 257/787; 257/686; 257/685; 257/723; 257/730; 257/777; 257/666; 257/676; 438/123; 438/121; 438/106; 438/111; 361/790; 361/820
[58] Field of Search ...................... 257/666, 676, 257/723, 730, 778, 777, 686, 685, 678, 787, 786; 438/123, 121, 106, 127, 107, 110, 111; 361/790, 820

[56] References Cited

U.S. PATENT DOCUMENTS

| 5,239,198 | 8/1993 | Lin et al. ........................ 257/691 |
| 5,523,608 | 6/1996 | Kitaoka et al. .................. 257/676 |
| 5,545,922 | 8/1996 | Golwalkar et al. ............... 257/676 |
| 5,585,668 | 12/1996 | Burns ............................ 257/676 |
| 5,615,089 | 3/1997 | Yoneda et al. ................. 361/764 |
| 5,646,829 | 7/1997 | Sota ............................. 257/676 |
| 5,719,436 | 2/1998 | Kuhn ............................ 252/676 |
| 5,724,233 | 3/1998 | Honda et al. ................... 257/676 |
| 5,793,101 | 8/1998 | Kuhn ............................ 257/676 |
| 5,814,881 | 9/1998 | Alagaratnam et al. ........... 257/686 |
| 5,834,836 | 11/1998 | Park et al. ..................... 257/686 |

FOREIGN PATENT DOCUMENTS 4-106961 4/1992 Japan .
8-213412 8/1996 Japan .

*Primary Examiner*—Alexander O. Williams
*Attorney, Agent, or Firm*—Nixon & Vanderhye P.C.

[57] ABSTRACT

A method of manufacturing a semiconductor device including two semiconductor chips having mutually different element forming face areas on respective surfaces of a die pad of a lead frame prepared by sealing the semiconductor chips with resin by setting the lead frame in a resin sealing use mold having an injection gate for injecting therethrough a sealing resin, includes the steps of: (a) mounting the semiconductor chips on respective surfaces of the die pad in such a manner that when setting the lead frame in the resin sealing use mold, a distance between a side face of the semiconductor chip having a larger element forming face area on the injection gate side and a side face of the semiconductor chip having a smaller element forming face area on the injection gate side becomes shorter than a distance when these semiconductor chips are mounted at a center on respective surfaces of the die pad; (b) setting the lead frame in the resin sealing use mold so that the above side faces of the semiconductor chips are positioned on the injection gate side; and (c) injecting the sealing resin from the injection gate.

12 Claims, 12 Drawing Sheets

SEMICONDUCTOR DEVICE SEALED WITH A SEALING RESIN AND INCLUDING STRUCTURE TO BALANCE SEALING RESIN FLOW

FIELD OF THE INVENTION

The present invention relates to a semiconductor device which can be installed in light-weight and compact electric equipment and also relates to a method of manufacturing such a semiconductor device.

BACKGROUND OF THE INVENTION

Conventionally, various types of semiconductor devices which store therein a single semiconductor chip 51 as shown in FIG. 8 and FIG. 9 have been proposed (referred to as Prior Art 1). Such a semiconductor device is generally manufactured in the following manner. On a die pad 55 of a lead frame 54, a semiconductor chip 51 is mounted using a thermosetting die-attach material 53 such as silver paste, etc. (hereinafter referred to as die-bonding). Then, the die-attach material 53 is hardened by a heat treatment to fix the semiconductor chip onto the die pad 55 (bonding process).

Thereafter, electrode pads 52 formed on an element forming face of the semiconductor chip 51 are electrically connected to inner leads 56 formed in the lead frame 54 by means of bonding wires 59 such as gold wires, etc., (wire-bonding process). Further, after the above members are sealed with a sealing resin 60, a tie bar (not shown) (the blocking section of the sealing resin 60) formed in the lead frame 54 and support leads 58 for supporting the die pad 55 are cut off, and outer leads 57 are bent (formed) in a shape as desired, thereby preparing a semiconductor device.

In recent years, to meet demands for more compact and lighter weight electric apparatuses, as shown in FIG. 10 and FIG. 11, various 2-chip 1-package semiconductor devices (Prior Art 2) whereon the semiconductor chips 51a and 51b of the same or different sizes are mounted on respective surfaces of the die pad 55 have been adopted. Such a semiconductor device is manufactured, for example, by the method disclosed by Japanese Unexamined Patent Publication 213412/1996 (Tokukaihei 8-213412) wherein the respective rear surfaces (the other faces of the element forming faces) of the semiconductor chips 51a and 51b face each other.

Namely, on one surface of the die pad 55, a semiconductor chip 51a is mounted using a paste-like die-attach material 53a such as silver or non-silver paste, etc. Then, the die-attach material 53a is cured under an applied heat to fix the semiconductor chip 51a onto the die pad 55. Thereafter, a semiconductor chip 51b is mounted using a paste-like die-attach material 53b. Then, the die-attach material 53b is cured under an applied heat to connect the semiconductor chip 51a to the die pad 55.

Thereafter, the electrode pads 52a of the semiconductor chip 51a and the inner leads 56 are wire-bonded by the bonding wires 59a such as gold wires, etc. For the other semiconductor chip 51b, in the described manner, the electrode pads 52b and the inner leads 56 are wire-bonded by the bonding wires 59b. Subsequent processing is the same as the described technique of Prior Art 1.

In the arrangement of the conventional 2-chip 1-package semiconductor device on which the semiconductor chips 51a and 51b of different sizes are mounted, however, the following problems arise when manufacturing the semiconductor device.

Generally, as shown in FIG. 12, the process of sealing with resin is performed by setting the lead frame 54 (see FIG. 10) to a resin sealing mold 64 which includes a cavity 61 for forming the outer shape of the semiconductor device, an injection gate 62 for injecting therethrough the sealing resin 60, and an air vent 63 for deaerating the cavity 61.

When injecting the sealing resin 60 in the cavity 61 from the injecting position P under an applied substantially high pressure, due to the difference in size of the semiconductor chips 51a and 51b, the respective flow rates of the sealing resin 60 in a vicinity of the semiconductor chips 51a and 51b differ, and the sealing resin 60 becomes off-balance. Therefore, the balance of the die pad 55 is distorted, and the die pad 55 deviates in the direction vertical to the surface of the lead frame 54. As a result, the bonding wires 59a and 59b are exposed to the outside of the package (semiconductor device), or the bonding wires themselves are disconnected. Moreover, the semiconductor chips 51a and 51b are exposed to the outside of the package, and the yield of the device is lowered. A resulting inferior appearance with the bonding wires 59a and 59b exposed to the outside of the package is observed in nearly 80 percent of the devices thus manufactured.

In recent years, there is a tendency of adopting thinner chips, die pads 55 or lead frames 54 to meet an increasing demand for a thinner package, and therefore the described problems have become more noticeable.

In order to solve the described problems, it is necessary to maintain the flow rate of the sealing resin 60 in the vicinity of the semiconductor chip 51a substantially equivalent to the flow rate of the sealing resin 60 in the vicinity of the semiconductor chip 51b to ensure a well-balanced state of the die pad 55.

For example, it may be arranged so as to bend the support leads 58 beforehand, and displace the die pads 55 in the vertical direction beforehand with respect to the surface of the lead frame 54. However, in the 2-chip 1-package semiconductor device, it is difficult to ensure the mechanical precision for adjusting a fine offset (displacement) of several tens micron order.

For example, the respective thicknesses of the semiconductor chips 51a and 51b to be sealed in one semiconductor device have been considered. In this method, however, it is difficult to control the manufacturing process.

For example, Japanese Unexamined Patent Publication No. 106961/1992 (Tokukaihei 4-106961) discloses a 1-chip 1-package optical semiconductor device wherein a CCD (charge coupled element), etc., is formed using transparent sealing resin. In this semiconductor device, a semiconductor chip is mounted in such a manner that the side of the semiconductor chip is in alignment with the side of the die pad or it is placed outside of the die pad. This permits voids generated when injecting the resin to be released, thereby preventing a drop in yield by the inferior appearance.

The voids indicate bubbles which hinder the entering of light, especially at the blind spot when seen from the injection gate, i.e., on the opposite side of the injection gate in the cavity. However, the described arrangement of the above publication eliminates the problem of generating voids at the above position.

In order to avoid a drop in yield of the 2-chip 1-package semiconductor device, one may apply the described arrangement for 1-chip 1-package semiconductor device to 2-chip 1-package semiconductor devices. Namely, semiconductor chips may be mounted in such a manner that respective end faces of the semiconductor chips of different sizes are in alignment with the end faces of the die pad or are placed outside the die pad.

However, in the described method, a still greater deviation of the die pad than that occurred in the arrangement of FIG. 12 would occur. Additionally, as described earlier, in the 2-chip 1-package semiconductor device, different from the 1-chip 1-package semiconductor device, it is difficult to adjust the offset for suppressing deviations in the die pad.

When adopting the described method, it is required to set such that the die-attach material for mounting each semiconductor chip to the die pad is not protruded from the die pad. Therefore, only a small amount of the die-attach material can be used. For this reason, in the case of mounting a semiconductor chip of a small size, it is very likely that the semiconductor chip is separated from the die pad when wire-bonding. Additionally, in the case where the semiconductor chip is mounted so that the end face of the semiconductor chip is exposed to the outside of the die pad, it is more likely that the problem of separating the semiconductor chip from the die pad occurs.

SUMMARY OF THE INVENTION

It is an object of the present invention to provide a 2-chip 1-package semiconductor device to which a variety of combinations of semiconductor chips of different sizes can be applied without lowering the yield of the semiconductor device. It is also an object to provide a method of manufacturing the same.

In order to achieve the above objects, a semiconductor device is manufactured including first and second semiconductor chips having mutually different element forming face areas on respective surfaces of a semiconductor chip mounting substrate of a lead frame. The first semiconductor chip has a larger element forming face area than an element forming face area of the second semiconductor chip. The first and second semiconductor chips are sealed with resin by setting the lead frame in the resin sealing mold having an injection gate for injecting a sealing resin therethrough. The method of manufacturing the semiconductor device includes the steps of:

(a) mounting the first and second semiconductor chips on respective surfaces of the semiconductor chip mounting substrate in such a manner that when setting the lead frame in the resin sealing mold, a distance between a first side face of the first semiconductor chip on the injection gate side and a first side face of the second semiconductor chip on the injection gate side becomes shorter than a distance between the first side face of the first semiconductor chip and the first side face of the second semiconductor chip when the first and second semiconductor chips are mounted at a center on respective surfaces of the semiconductor chip mounting substrate;

(b) setting the lead frame in the resin sealing mold so that the respective first side faces of the first and second semiconductor chips are positioned on the injection gate side; and (c) injecting the sealing resin from the injection gate.

According to the described first manufacturing method, when setting the lead frame in the resin sealing mold, the first and second semiconductor chips are mounted in such a manner that the distance between the first side face of the first semiconductor chip on the injection gate side and the first side face of the second semiconductor chip on the injection gate side becomes shorter than the distance between the first side face of the first semiconductor chip and the first side face of the second semiconductor chip when the first and second semiconductor chips are mounted at the center on respective surfaces of the semiconductor chip mounting substrate. Therefore, when setting the lead frame in the resin sealing mold for sealing the semiconductor chips with the resin, a deviation in the stress applied onto the respective surfaces of the semiconductor chip mounting substrate can be reduced. As a result, the displacement in the thickness direction of the semiconductor chip mounting substrate can be suppressed.

Therefore, when sealing with resin semiconductor chips having different element forming face areas mounted on respective surfaces of the semiconductor chip mounting substrate, for example, a problem wherein a semiconductor chip is exposed to the outside of the package due to the deviation of the semiconductor chip mounting use substrate can be avoided. As a result, a drop in yield of the semiconductor device can be prevented, and a quality 2-chip 1-package semiconductor device can be obtained, even if chips of different sizes are mounted via the semiconductor mounting substrate.

In the step (a) of the described first manufacturing method, it is preferable that the first and second semiconductor chips be mounted on respective surfaces of the semiconductor chip mounting substrate in such a manner that the respective first side faces of the first and second semiconductor chips are positioned so as to substantially oppose each other via the semiconductor chip mounting substrate.

According to the described method, since the respective first side faces of the first and second semiconductor chips are positioned so as to substantially oppose each other via the semiconductor chip mounting substrate, a deviation in the stress applied onto the respective surfaces of the semiconductor chip mounting substrate in a vicinity of the injection gate can be still reduced, and the displacement of the semiconductor chip mounting substrate in the thickness direction can be further suppressed compared with the aforementioned arrangement. Accordingly, the aforementioned effects can be more surely achieved.

In order to achieve the above object, the second method of manufacturing a semiconductor device of the present invention is provided. The semiconductor device includes first and second semiconductor chips having mutually different element forming face areas on respective surfaces of a semiconductor chip mounting substrate of a lead frame. The first semiconductor chip has a larger element forming face area than an element forming face area of the second semiconductor chip. The first and second semiconductor chips are sealed with resin by setting the lead frame in the resin sealing mold having an injection gate for injecting a sealing resin therethrough. The method includes the steps of:

(a) mounting the first and second semiconductor chips on respective surfaces of the semiconductor chip mounting substrate;

(b) forming a flow balancing member around the second semiconductor chip for balancing a flow rate of the sealing resin when injecting the sealing resin so that a flow rate of the sealing resin in a vicinity of the first semiconductor chip is substantially equivalent to a flow rate of the sealing resin in a vicinity of the second semiconductor chip; and (c) setting the lead frame on which the first and second semiconductor chips as well as the flow balancing member are mounted in the resin sealing mold and injecting the sealing resin from the injection gate.

According to the described second manufacturing method, by forming the flow balancing member at the periphery of the second semiconductor chip, the flow rate (volume) of the sealing resin in the vicinity of the first semiconductor chip becomes substantially equivalent to the flow rate (volume) of the sealing resin in the vicinity of the second semiconductor chip. As a result, in the process of sealing with resin, the problem wherein the semiconductor chip mounting substrate is off-balance and is displaced in the thickness direction can be suppressed.

In the described second method, it is preferable that the flow balancing member be formed in such a manner that the overall outer shape of the semiconductor chip and the flow balancing member is substantially equivalent to the outer shape of the first semiconductor chip.

The above method permits the described effect to be more surely achieved.

Therefore, when sealing with resin by mounting the semiconductor chips having different element forming face areas on respective surfaces of the semiconductor chip mounting substrate, for example, a problem wherein a semiconductor chip is exposed to the outside of the package due to the deviation of the semiconductor chip mounting use substrate can be avoided. As a result, a drop in yield of the device can be prevented, and a quality 2-chip 1-package semiconductor device can be obtained even if chips of different sizes are mounted via the semiconductor mounting substrate.

It is preferable that the described first and second methods further include the step of fixing support leads for supporting the semiconductor chip mounting substrate and inner leads to which electrode pads of the semiconductor chips are electrically connected.

According to the described method, support leads and inner leads are fixed, and therefore, when injecting the sealing resin, the deviation in the thickness direction of the semiconductor chip mounting substrate supported by the support leads can be more surely suppressed.

It is preferable that the described first and second methods further include the step of forming a recessed portion which is cut towards an inside of the semiconductor chip mounting substrate on a part of the semiconductor chip mounting substrate outside semiconductor chip mounting areas.

According to the described method, since the recessed portion is formed at a part of the semiconductor chip mounting substrate outside the semiconductor chip mounting area, the sealing resin to be injected in the resin sealing mold penetrates inside the resin sealing mold via the recessed portion with ease. Namely, by forming the recessed portion, the sealing resin can be injected, for example, into the blind spot of the injection gate. As a result, a problem wherein the void remains in the blind spot of the injecting gate can be prevented, thereby providing a more reliable and more stable semiconductor device.

For a fuller understanding of the nature and advantages of the invention, reference should be made to the ensuing detailed description taken in conjunction with the accompanying drawings.

DETAILED DESCRIPTION OF PREFERRED EMBODIMENTS

[Embodiment 1]

Figure 1:
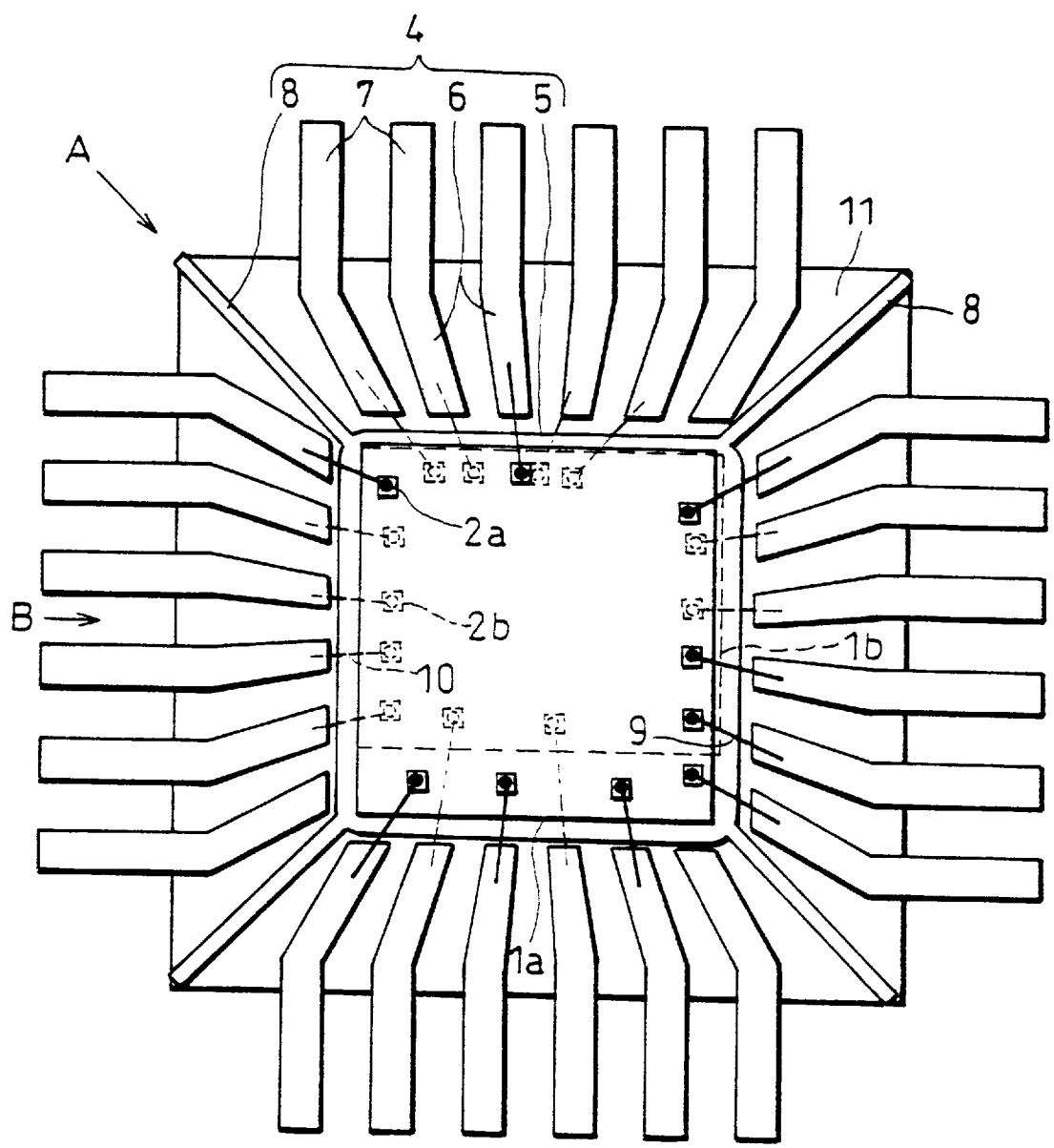
FIG. 1 is a plan view of a 2-chip 1-package semiconductor device in accordance with one embodiment of the present invention.
Figure 2:
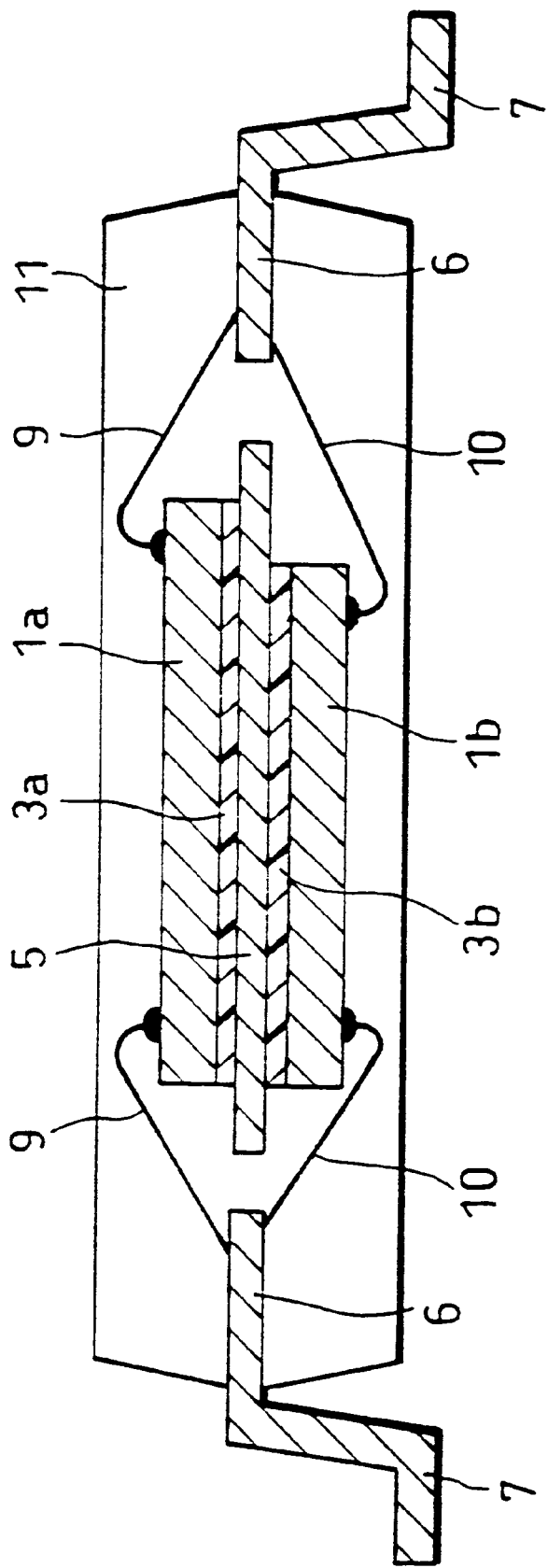
FIG. 2 is a cross-sectional view of the semiconductor device of FIG. 1.
Figure 3:
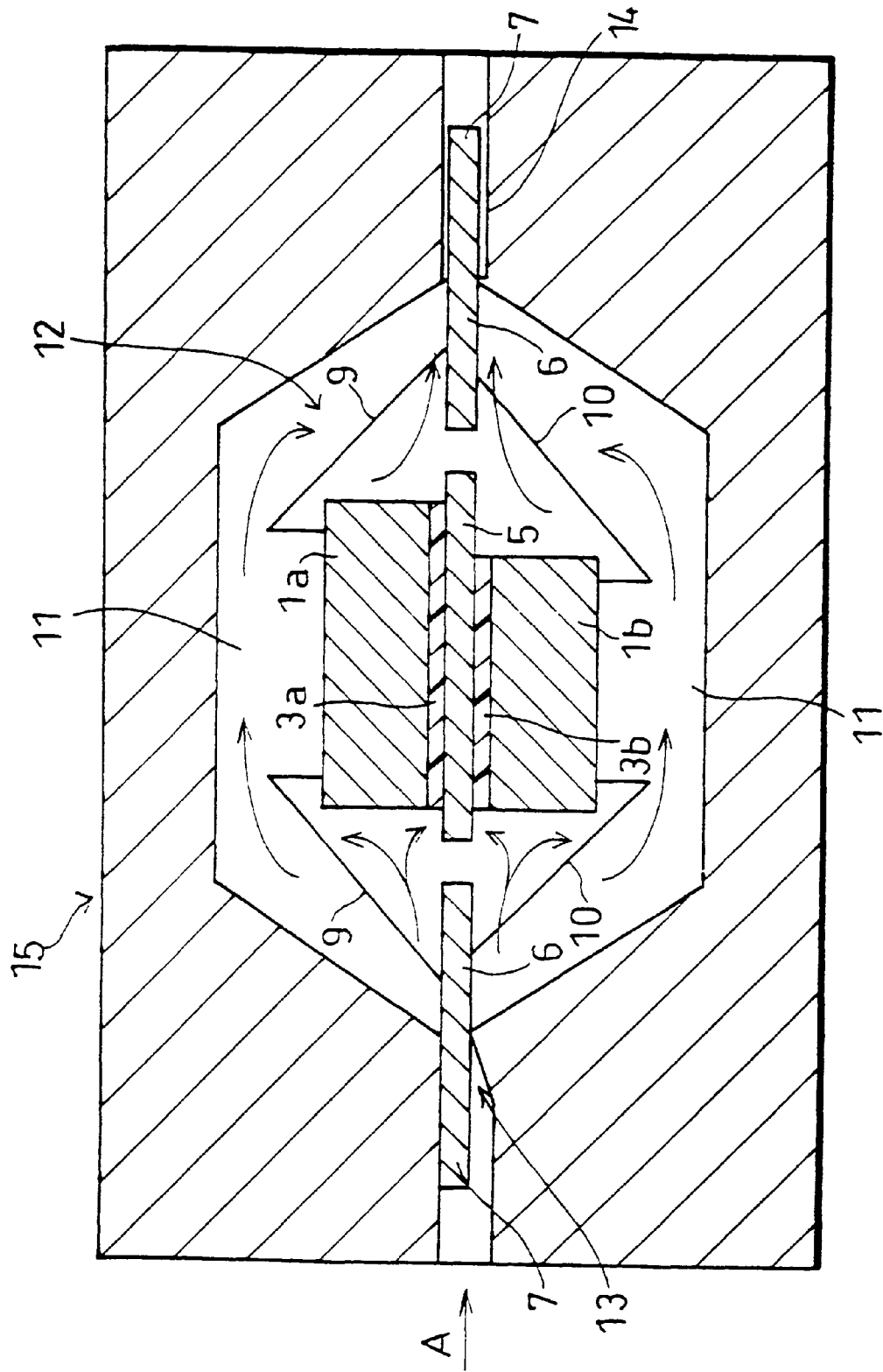
FIG. 3 is a cross-sectional view showing how the resin is sealed in a state where a lead frame is set in a resin sealing use mold.

The following description will explain one embodiment of the present invention in reference to FIG. 1 through FIG. 3.

FIG. 1 is a plan view of a semiconductor device of the present embodiment. FIG. 2 is a cross-sectional view of the semiconductor device taken from the direction of arrow B in FIG. 1.

As shown in FIG. 1 and FIG. 2, the semiconductor device in accordance with the present embodiment is arranged such that two semiconductor chips 1a and 1b of different sizes are mounted on the front and rear surfaces of a die pad 5 of a plate like lead frame 4 using thermosetting die-attach materials 3a and 3b in the form of a paste.

In the present embodiment, the semiconductor chip 1a has a size of 6 mm×6 mm, and the semiconductor chip 1b has a size of 6.5 mm×4 mm. Namely, the semiconductor chip 1b (second semiconductor chip) has a smaller element forming face area than the semiconductor chip 1a (first semiconductor chip).

The semiconductor chip 1a is mounted substantially at the center of one surface of the die pad 5 via a die-attach material 3a. The semiconductor chip 1b is mounted on the other surface of the die pad 5 in more close proximity to an injecting position A of the sealing resin 11 than the center of the die pad 5 via the die-attach material 3b. Namely, semiconductor chip 1b is mounted in close proximity to an injection gate 13 (see FIG. 3) for injecting the sealing resin 11 therethrough via the die-attach material 3b.

In the present embodiment, the semiconductor chips 1a and 1b are mounted respectively on the front and rear surfaces of the die pad 5 in such a manner that at least the side on the injection gate side of the four side faces of the semiconductor chip 1a is positioned so as to oppose the corresponding side of the semiconductor ship 1b via the die pad 5. The described arrangement suppresses not only a force applied to both front and rear surfaces of the die pad 5 but also a displacement of the die pad 5 in the depth direction.

The semiconductor chip 1a includes a plurality of electrode pads 2a on the element forming face. Each electrode pad 2a is electrically connected to the corresponding inner lead 6 in the lead frame 4 via a bonding wire 9 such as a gold wire, etc. The semiconductor chip 1b includes a plurality of electrode pads 2b on the element forming face. Each electrode pad 2b is electrically connected to the corresponding inner lead 6 via a bonding wire 10 such as a gold wire, etc., as in the semiconductor chip 1a.

Here, the same material is adopted for the die-attach materials 3a and 3b. In the case where the same silicon substrates are adopted for the semiconductor chips 1a and 1b to be operated at the same substrate potential, thermo-setting silver paste in which scaly silver powders are mixed is generally adopted for the die-attach materials 3a and 3b. However, in consideration of costs, etc., non-silver paste, etc., in which spherical silica powders, etc., are mixed may be adopted. On the other hand, in the case where different substrates are adopted for the semiconductor chips 1a and 1b or they are operated at different substrate potentials, die-attach materials 3a and 3b made of non-silver paste are generally adopted.

The lead frame 4 includes the die pad 5, the inner lead 6, the outer lead 7, the support lead 8, and a cradle section (not shown) which are connected at the outer frame portion thereof. The die pad 5 is a semiconductor chip mounting substrate having the semiconductor chips 1a and 1b mounted on the front and rear surfaces respectively. The die pad 5 has a sufficient size so that the semiconductor chips 1 and 1b mounted thereon are not protruded from the periphery thereof. The die pad 5 and the inner lead 6 are sealed (molded) with the sealing resin 11, etc., together with the semiconductor chips 1a and 1b. The support leads 8 are provided for supporting the die pad 5. The cradle section is provided for transporting the lead frame 4.

The method of manufacturing the semiconductor device of the present embodiment will be explained in detail.

First, the connecting regions of the bonding wires 9 and 10 on both front and rear surfaces of the inner lead 6 are plated beforehand with a silver metal, etc. Next, the semiconductor chip 1a is mounted on one surface of the die pad 5 via the die-attach material 3a. Here, the die-attach material 3b is cured with an applied heat at 180° for 1 hour.

Thereafter, the lead frame 4 is reversed, and the semiconductor chip 1b is mounted in more close proximity to the injecting position A of the sealing resin 11 than the center of the die pad 5 mounted on the other surface of the die pad 5 via the die-attach material 3b so as to avoid damage on the semiconductor chip 1a by supporting the element forming face of the semiconductor chip 1a with an elastic member (not shown). Here, the die-attach material 3b is cured under an applied heat at 180° C. for 1 hour. The semiconductor chip 1b may be mounted on the die pad 5 before mounting the semiconductor chip 1a.

Next, after electrically connecting the electrode pad 2b of the semiconductor chip 1b and the corresponding inner lead 6 via the bonding wire 10, the lead frame 4 is reversed, and the electrode pad 2a of the semiconductor chip 1a and the corresponding inner lead 6 are electrically connected via the bonding wire 9 in the described manner. As in the case of mounting the semiconductor chips 1a and 1b to the die pad 5, the semiconductor chips 1a and 1b are not damaged, for example, by supporting the element forming faces of the semiconductor chips 1a and 1b by the elastic member. In the described connecting process, an ultrasonic thermocompression bonding method in which both ultrasonic and heat are applied is adopted (heating temperature of around 250°). It may be arranged so as to carry out a wire bonding on the side of the semiconductor chip 1a prior to the semiconductor chip 1b.

Thereafter, as shown in FIG. 3, the lead frame 4 is cramped to the resin sealing mold 15 which includes the cavity 12, the injection gate 13 and the air vent 14, and the sealing resin 11 is injected from the injection gate 13. The cavity 12 is provided for forming the outer frame of the semiconductor device. The injection gate 13 is provided for injecting the sealing resin 11 therethrough. The air vent 14 is provided for evacuating the cavity 12. An arrow in the figure indicates a direction in which the sealing resin 11 flows. Here, the resin sealing mold 15 is heated by the heater (not shown).

Thereafter, the tie bar (not shown) or the support leads 8 formed on the lead frame 4 are cut off so as to prevent the sealing resin 11 from flowing into the spacing formed between the adjoining outer leads 7, and the outer leads 7 are bent in a shape as desired, thereby manufacturing a semiconductor device.

Figure 12:
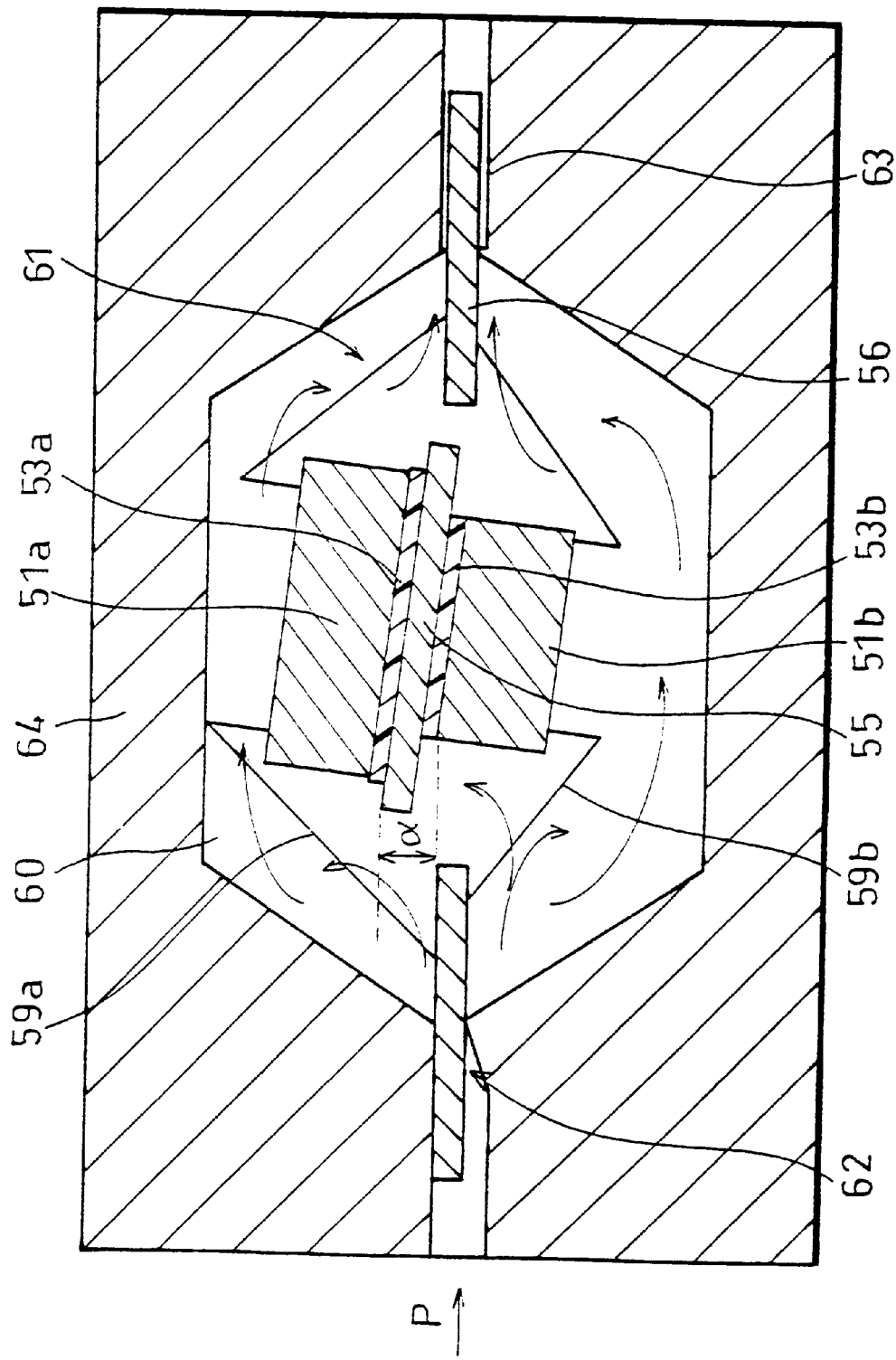
FIG. 12 is a cross-sectional view showing variations in the thickness direction of the die pad in the process of sealing the resin when manufacturing the semiconductor device.

In the semiconductor device thus formed and the conventional semiconductor device, the respective amounts of deviation were measured at four corners of the die pad 5. The data shown in Table 1 indicate the maximum amount of displacement at four corners of the die pad 5 and the maximum value of the amount of displacement measured by 136 semiconductor devices. The amount of displacement suggests the amount of deviation (indicated as α in FIG. 12) of the die pad 5 from the original position of the die pad 5 (the center of the semiconductor device in the thickness direction).

TABLE 1

| | MAXIMUM VALUE OF THE AMOUNT OF DEVIATION OF DIE PAD [μm] |
|---|---|
| SEMICONDUCTOR DEVICE OF THE PRESENT INVENTION | 68 |
| CONVENTIONAL SEMICONDUCTOR DEVICE | 258 |

The tolerance in the thickness direction of the die pad 5 due to manufacturing the lead frame 4 is ±50 μm.

As is clear from the results shown in Table 1, the amount of displacement of the die pad 5 was small in the semiconductor device of the present embodiment, which indicates that the amount of displacement of the die pad 5 has improved even in consideration of the tolerance. The above effect can be achieved from the following mechanism. Since the semiconductor chip 1b is mounted in more close proximity to the injection gate 13 than the center of the die pad 5, a deviation in the applied force on both surfaces of the die pad 5 in a vicinity of the injection gate 13 can be suppressed, and the amount of displacement of the die pad 5 in the thickness direction can be suppressed. Additionally, in the present embodiment, an inferior appearance such as an exposure of the bonding wires 9 and 10 was not observed.

Therefore, according to the arrangement of the present embodiment, as the displacement of the die pad 5 in the thickness direction when injecting the sealing resin 11 can be suppressed, the problem wherein the device becomes less presentable is less likely to occur. As a result, a high quality 2-chip 1-package semiconductor device can be ensured even when adopting a combination the chips of various sizes.

As described, a semiconductor device of the present invention has two semiconductor chips 1b and 1a (first and second semiconductor chips) having mutually different element forming face areas on respective surfaces of a die pad 5 of a lead frame 4. The device is prepared by sealing the semiconductor chips 1a and 1b with resin by setting the lead frame 4 in a resin sealing use mold 15 having an injection gate 13 for injecting a sealing resin therethrough. The method of manufacturing the semiconductor device includes the steps of: (a) mounting the semiconductor chips 1a and 1b on respective surfaces of the die pad 5 in such a manner that when setting the lead frame 4 in the resin sealing mold 15, a distance between a side face of the semiconductor chip 1b having a larger element forming face area on the injection gate 13 side and a side face of the semiconductor chip 1a on the injection gate 13 side becomes shorter than a distance between the side faces when these semiconductor chips 1a and 1b are mounted at a center on respective surfaces of the die pad 5; (b) setting the lead frame 4 in the resin sealing mold 15 so that the above side faces of the semiconductor chips 1a and 1b are positioned on the injection gate 13 side; and (c) injecting the sealing resin from the injection gate 13.

According to the described first manufacturing method, when setting the lead frame 4 in the resin sealing mold 15, the semiconductor chips 1a and 1b are mounted such that a distance between the respective side faces of the semiconductor chip 1a and 1b on the injection gate 13 side becomes shorter than a distance between these side faces of the semiconductor chips 1a and 1b when these first and second semiconductor chips 1a and 1b are mounted at a center on respective surfaces of the die pad 5. Therefore, when setting the lead frame in the resin sealing mold 15 for sealing the semiconductor chips 1a and 1b with the resin, a deviation in stress applied onto the respective surfaces of the die pad 5 can be reduced. As a result, the displacement in the thickness direction of the die pad 5 can be suppressed.

Therefore, when sealing with resin by mounting the semiconductor chips 1a and 1b having different element forming face areas on respective surfaces of the die pad 5, for example, a problem wherein a semiconductor chip is exposed to the outside of the package due to the deviation of the die pad 5 can be avoided. As a result, a drop in yield of the device can be prevented, and a quality 2-chip 1-package semiconductor device can be obtained even if chips of different sizes are mounted on the semiconductor mounting substrate.

In step (a) of the described first manufacturing method, it is preferable that the semiconductor chip 1a is mounted at a central portion of the die pad 5, and when setting the lead frame 4 in the resin sealing mold 15, the semiconductor chip 1b is offset from the central portion of the die pad 5 so that the side face of the semiconductor chip 1b can be approximated to the injection gate side 13.

In step (a) of the described first manufacturing method, it is preferable that the semiconductor chips 1a and 1b be mounted on respective surfaces of the die pad 5 such that the respective side faces of the semiconductor chips 1a and 1b on the injection gate 13 side are positioned so as to substantially oppose each other via the die pad 5.

According to the described arrangement, since the respective side faces of the semiconductor chips on the injection gate 13 side are positioned so as to substantially oppose each other via the die pad 5, a deviation in stress applied onto the respective surfaces of the die pad 5 can be still reduced in a vicinity of the injection gate 13, and the displacement of the die pad 5 in the thickness direction can be further suppressed compared with the aforementioned arrangement. Accordingly, the aforementioned effects can be more surely achieved.

It is preferable that the described first method of manufacturing a semiconductor device further includes the step of:

forming a flow balancing member such as an insulating member 16 to be described later in the second embodiment for balancing a flow rate of the sealing resin 11 when injecting the sealing resin 11 so that a flow rate of the sealing resin 11 in a vicinity of the semiconductor chip 1b becomes substantially equivalent to a flow rate of the sealing resin 11 in a vicinity of the semiconductor chip 1a.

It is further preferable that the described flow balancing member is formed in such a manner that an overall outer shape of the semiconductor chip 1b and the flow balancing member is substantially equivalent to an outer shape of the semiconductor chip 1a.

It is preferable that the described first method of manufacturing a semiconductor device further includes the step of:

fixing support leads 8 for supporting the die pad 5 and inner leads 6 to which electrode pads 2a and 2b of the semiconductor chips 1a and 1b are electrically connected as will be explained later in the third embodiment.

It is preferable that the described first method of manufacturing a semiconductor device further includes the step of:

forming a recessed portion 5a which is cut towards an inside of the die pad 5 on a part of the die pad 5 outside semiconductor chip mounting areas as will be explained later in the third embodiment.

[Embodiment 2]

Figure 4:
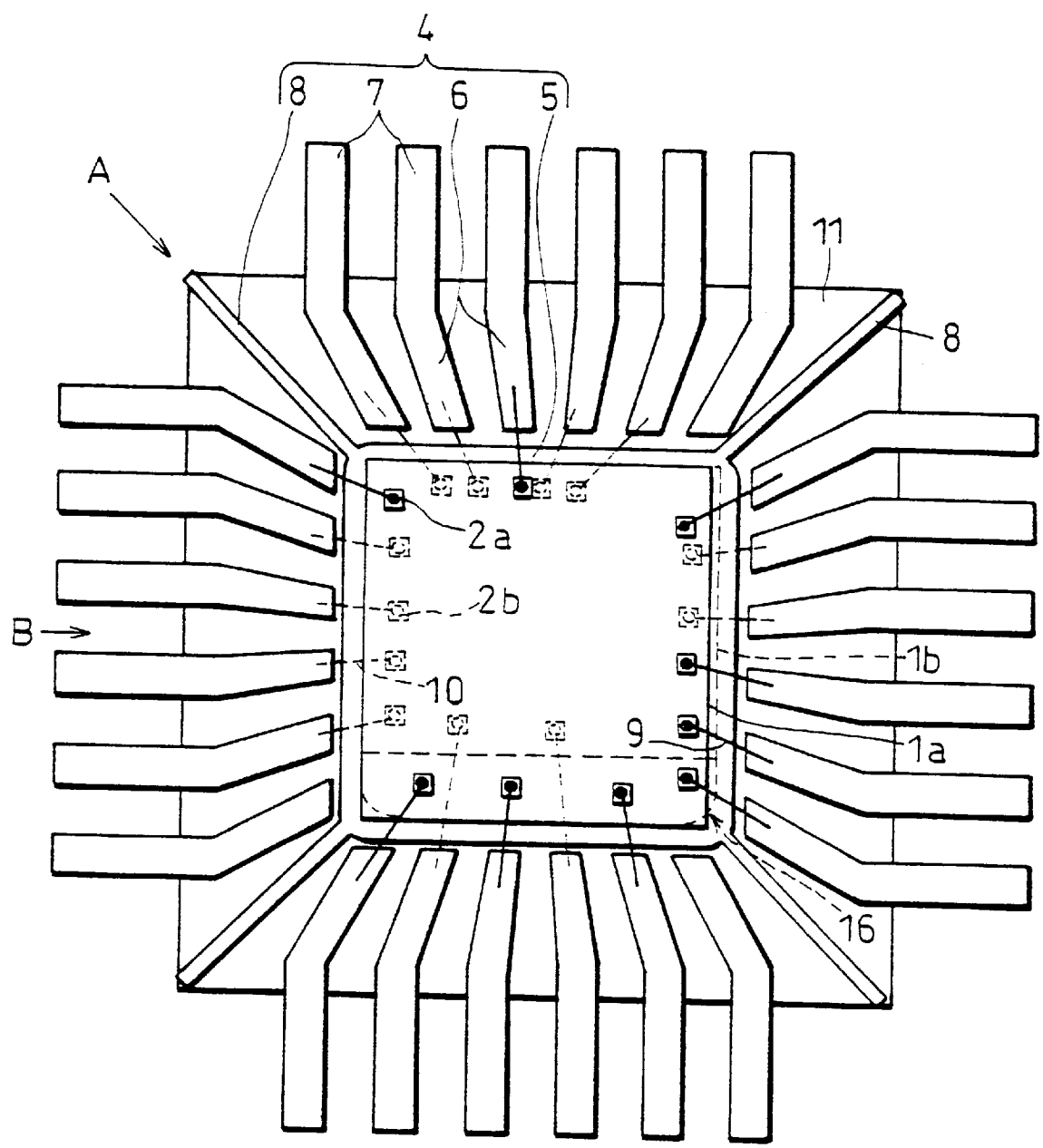
FIG. 4 is a plan view of a semiconductor device having an arrangement wherein an insulating member is formed at one part of the periphery of the semiconductor chip having a smaller element forming face area in accordance with another embodiment of the present invention.
Figure 5:
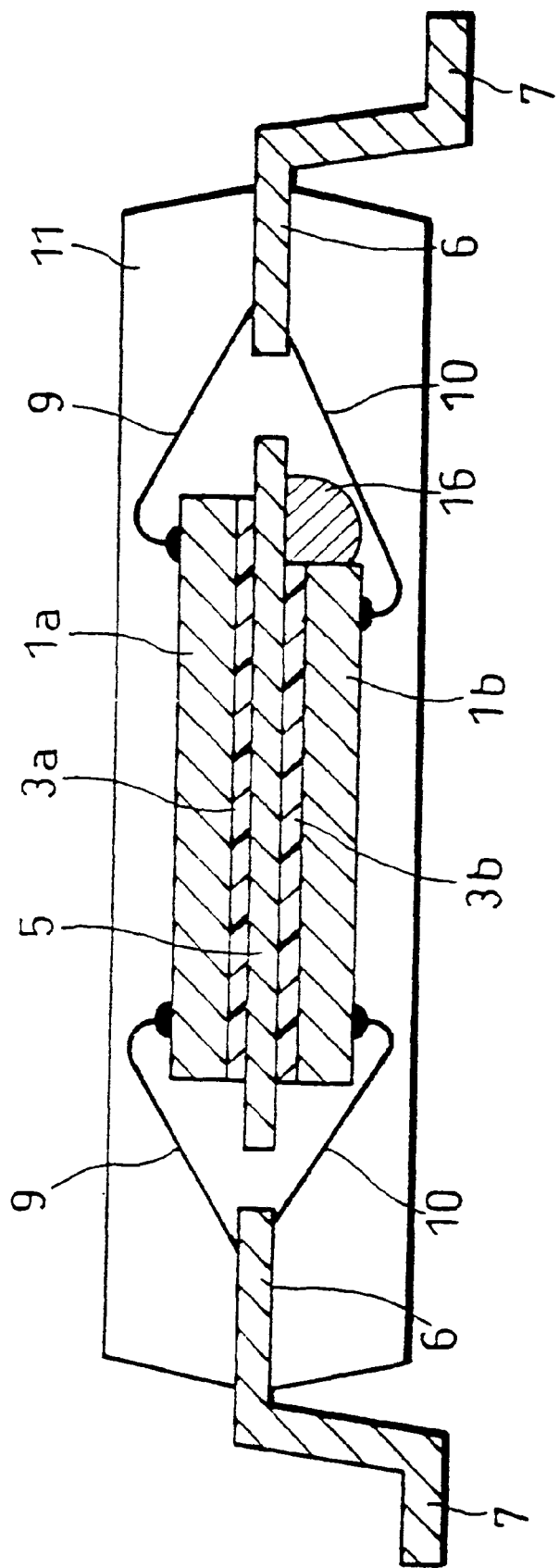
FIG. 5 is a cross-sectional view of the semiconductor device.

The following description will explain another embodiment of the present invention with reference to FIG. 4 and FIG. 5. The structures having the same functions as those of the previous embodiment will be designated by the same reference numerals and their descriptions will be omitted.

In the semiconductor device of the present embodiment having the arrangement of the first embodiment, a flow balancing member for balancing a flow rate of the sealing resin 11 is provided at one part of the periphery of the semiconductor chip 1b mounted on the surface of the die pad 5 so that the flow rate of the sealing resin 11 in a vicinity of the semiconductor chip 1a becomes substantially equivalent to the flow rate of the sealing resin 11 in a vicinity of the semiconductor chip 1b. In the present embodiment, the flow balancing member is an insulating member 16 prepared by hardening varnished polyimide resin by applying a heat treatment to varnished polyimide resin so as to volatilize a soluble portion.

In this case, the insulating member 16 can be provided such that the overall outer shape (volume) of the semiconductor chip 1b having a smaller element forming face area and the insulating member 16 is substantially equivalent to the outer shape (volume) of the semiconductor chip 1a having a larger element forming face area. According to the described arrangement, the flow rate (volume) of the sealing resin 11 in the vicinity of the semiconductor chip 1a becomes substantially equivalent to the flow rate (volume) of the sealing resin 11 in a vicinity of the semiconductor chip 1b. This offers such effect that even when sealing with the resin, the die pad 5 can be maintained in a more balanced state. Therefore, the displacement in the thickness direction of the die pad 5 can be still suppressed than the aforementioned arrangement of the EMBODIMENT 1, and the effects as achieved from the EMBODIMENT 1 can be more surely obtained.

In practice, the amount of displacement of the die pad 5 when injecting the sealing resin 11 through the injecting position A can be still reduced compared with the arrangement of the EMBODIMENT 1. Additionally, a generation of voids at symmetrical positions about the semiconductor chip 1b with the injecting position A can be eliminated.

When mounting the semiconductor chip 1b having a smaller element forming face area, the bonding wire 10 becomes relatively long, and the bonding wire 10 is likely to contact the edge portion of the semiconductor chip 1b or the die pad 5. By providing the insulating member 16 in a part of the periphery of the semiconductor chip 1b so as to avoid the contact with the bonding wire 10 and the edge portion, a drop in yield of the device due to a short circuit of the bonding wire 10 and the semiconductor chip 1b or the die pad 5 can be avoided.

In the present embodiment, the semiconductor chip 1b is mounted in more close proximity to the vicinity of the injection position A than the center of the die pad 5, and the insulating member 16 is formed in the relatively wide space on the surface of the die pad 5. However, it may be arranged such that the semiconductor chip 1b is mounted at the center of the die pad 5, and the insulating member 16 is formed on the entire periphery of the semiconductor chip 1b so that the flow rate of the sealing resin 11 in the vicinity of the semiconductor chip 1a becomes substantially equivalent to the flow rate of the sealing resin 11 in the vicinity of the semiconductor chip 1b.

In the above arrangement, even if the semiconductor chip 1b is not mounted on the side of the injection gate 13, the flow rate of the sealing resin 11 in a vicinity of the semiconductor chip 1a becomes substantially equivalent to the flow rate of the sealing resin 11 in a vicinity of the semiconductor chip 1b. Therefore, the problems in the process of sealing with resin that the die pad 5 becomes off-balance and the die pad 5 deviates in the thickness direction can be suppressed. Therefore, the described arrangement offers the same effects as achieved from the present embodiment.

As described, a semiconductor device of the present invention includes semiconductor chips 1a and 1b having mutually different element forming face areas on respective surfaces of a die pad 5 serving as a semiconductor chip mounting substrate of a lead frame 4. The semiconductor chip 1a has a larger element forming face area than an element forming face area of the semiconductor chip 1b, and the device prepared by sealing the semiconductor chips 1a and 1b with resin by setting the lead frame 4 in the resin sealing mold 15 having an injection gate 13 for injecting a sealing resin. The method according to this embodiment preferably includes the steps of:

(a) mounting the semiconductor chips 1a and 1b on respective surfaces of the die pad 5;

(b) forming an insulating member 15 serving as a flow balancing member around the semiconductor chip 1b for balancing a flow rate of the sealing resin when injecting the sealing resin so that a flow rate of the sealing resin in a vicinity of the semiconductor chip 1a becomes substantially equivalent to a flow rate of the sealing resin in a vicinity of the semiconductor chip 1b; and (c) setting the lead frame 4 on which the semiconductor chips 1a and 1b as well as the insulating member 16 are mounted in the resin sealing mold 15 and injecting the sealing resin from the injection gate 13.

In the described method, it is preferable that the insulating member 16 be formed such that the overall outer shape of the semiconductor chip 1b and the flow balancing member 16 is substantially equivalent to the outer shape of the semiconductor chip 1a.

According to the described second manufacturing method, by forming the insulating member 16 as the flow balancing member at the periphery of the semiconductor chip 1b, the flow rate (volume) of the sealing resin in the vicinity of the semiconductor chip 1a becomes substantially equivalent to the flow rate (volume) of the sealing resin in the vicinity of the semiconductor chip 1b. As a result, in the process of sealing with the resin, the problem wherein the die pad 5 is off-balance and is displaced in the thickness direction can be suppressed.

Therefore, when sealing with resin the semiconductor chips 1a and 1b having different element forming face areas on respective surfaces of the die pad 5, for example, a problem wherein a semiconductor chip is exposed to the outside of the package due to the deviation of the semiconductor chip mounting use substrate can be avoided. As a result, a drop in yield of the device can be prevented, and a quality 2-chip 1-package semiconductor device can be obtained even if chips of different sizes are mounted via the die pad 5.

It is preferable that the described second method of manufacturing a semiconductor device further includes the step of: it fixing support leads 6 for supporting the die pad 5 and inner leads 8 to which electrode pads 2a of the semiconductor chips 1a and 1b are electrically connected as will be explained later in the third embodiment.

It is preferable that the described second method of manufacturing a semiconductor device still further includes the step of:

forming a recessed portion 5a which is cut towards an inside of the die pad 5 on a part of the die pad 5 outside semiconductor chip mounting areas as will be explained later in the third embodiment.

[Embodiment 3]

Figure 6:
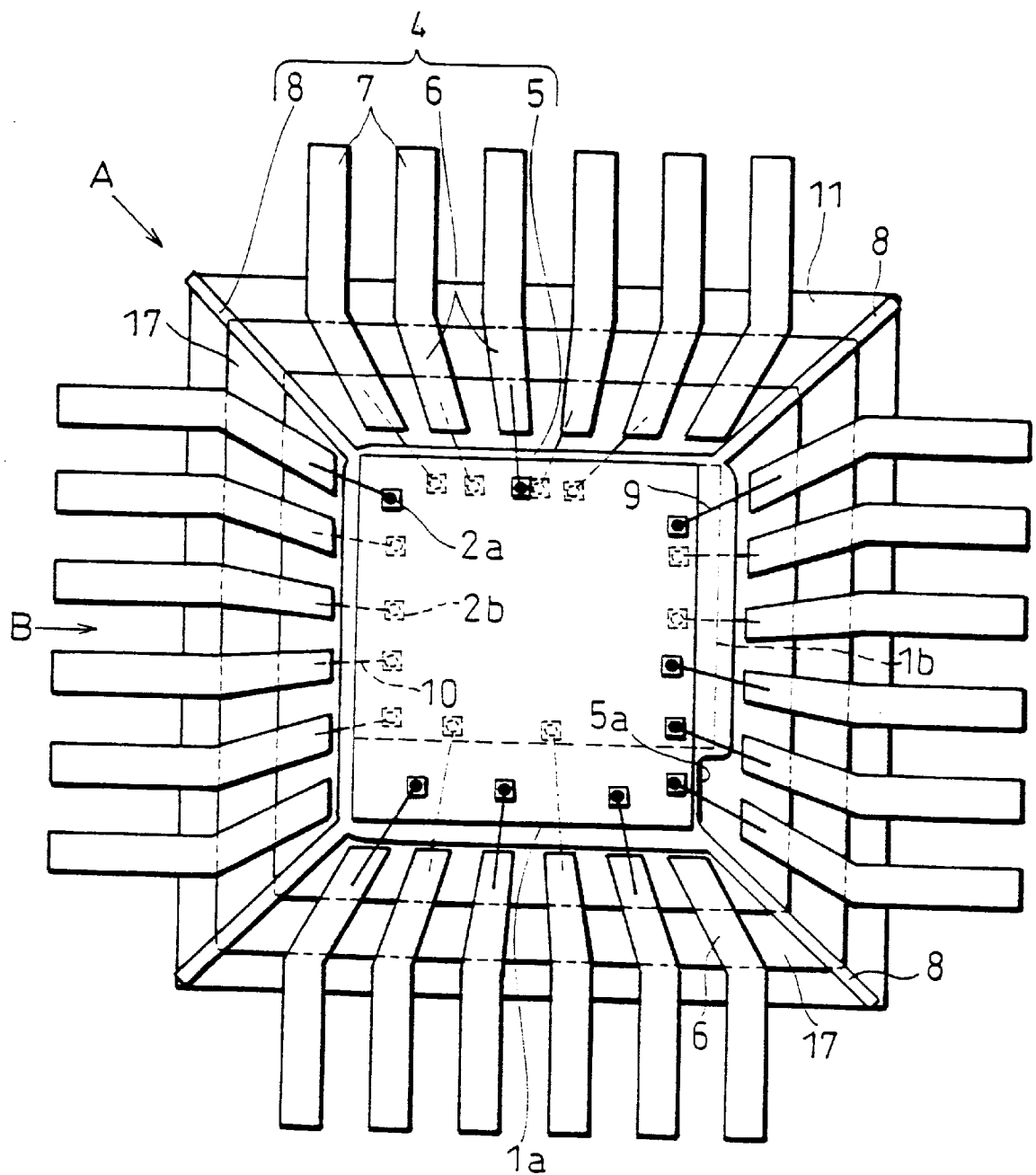
FIG. 6 is a plan view of the semiconductor device in accordance with still another embodiment of the present invention, wherein support leads and inner leads are fixed using a bonding sheet, and the recessed portion is formed in one part of the die pad outside the mounting area of the semiconductor chip.
Figure 7:
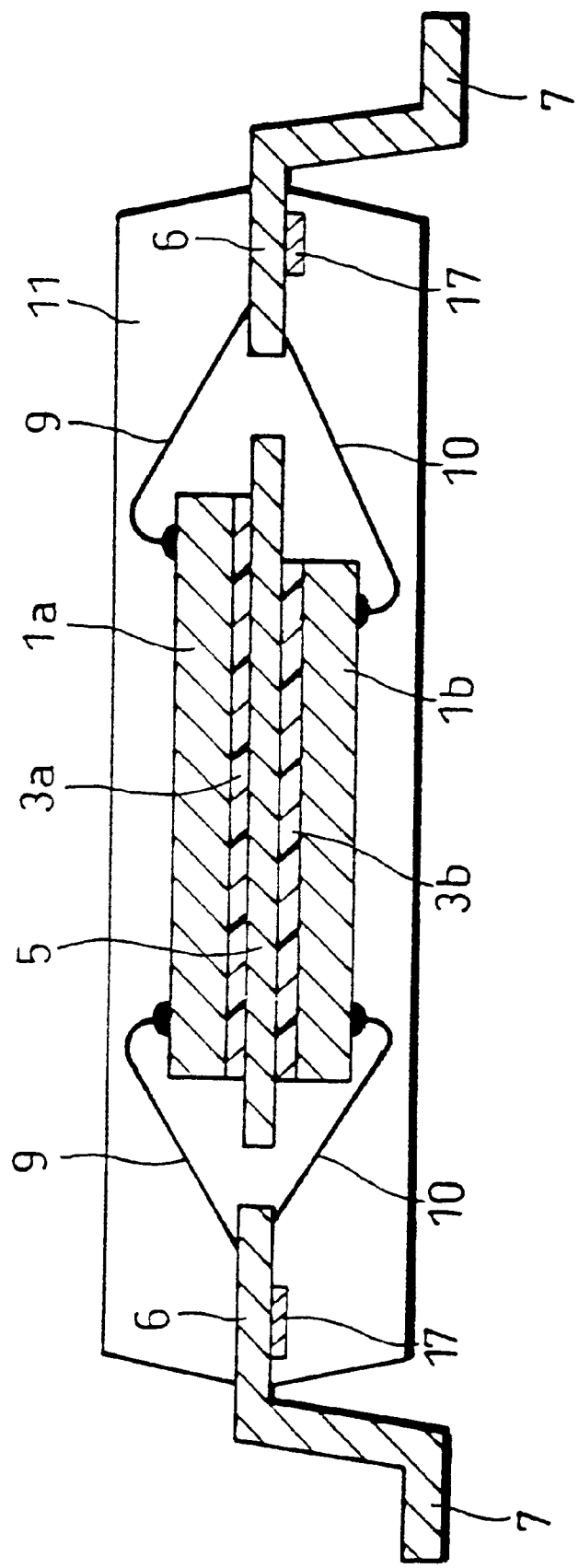
FIG. 7 is a cross-sectional view of the semiconductor device.
Figure 8:
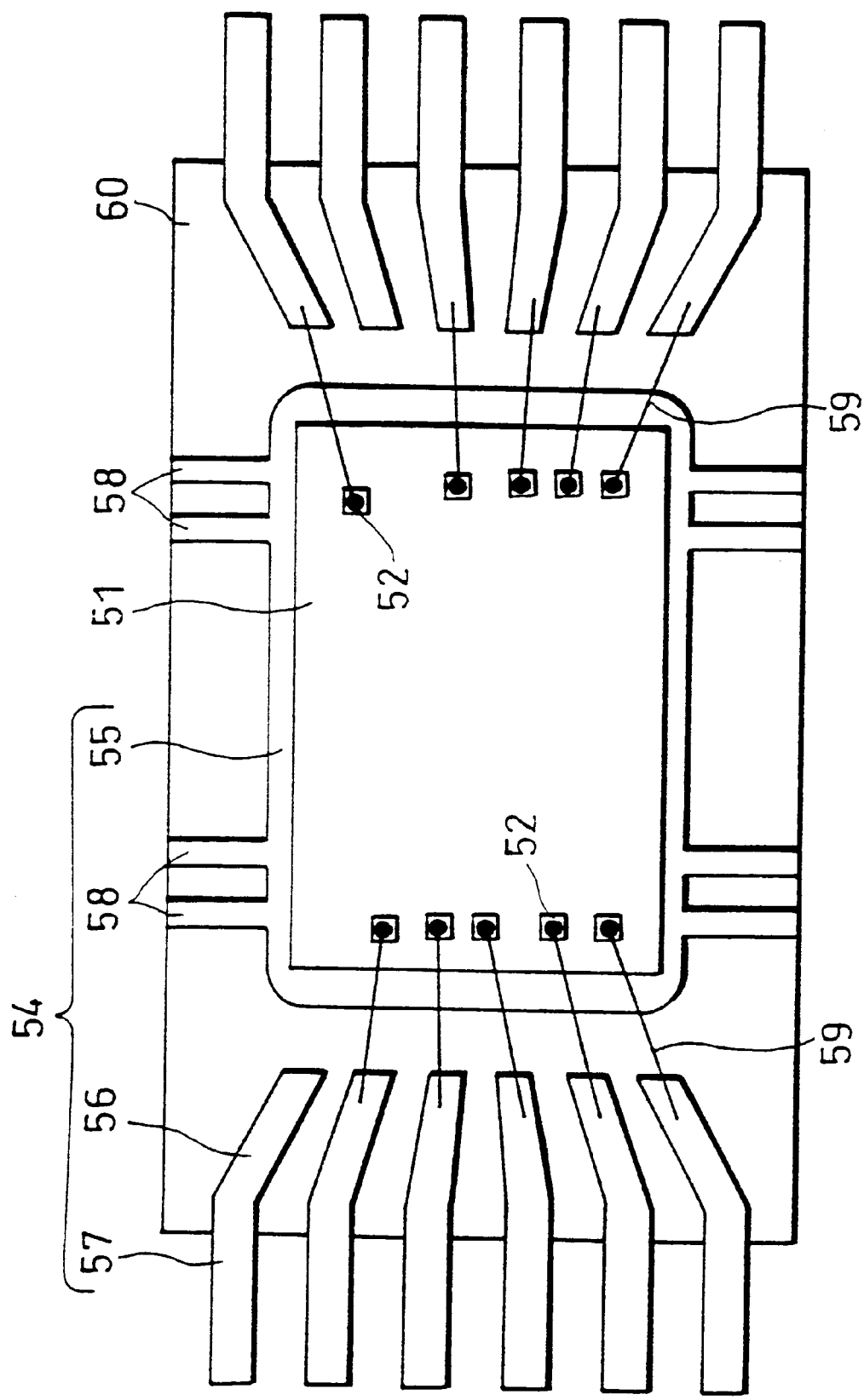
FIG. 8 is a plan view of a conventional 1-chip 1-package semiconductor device.
Figure 9:
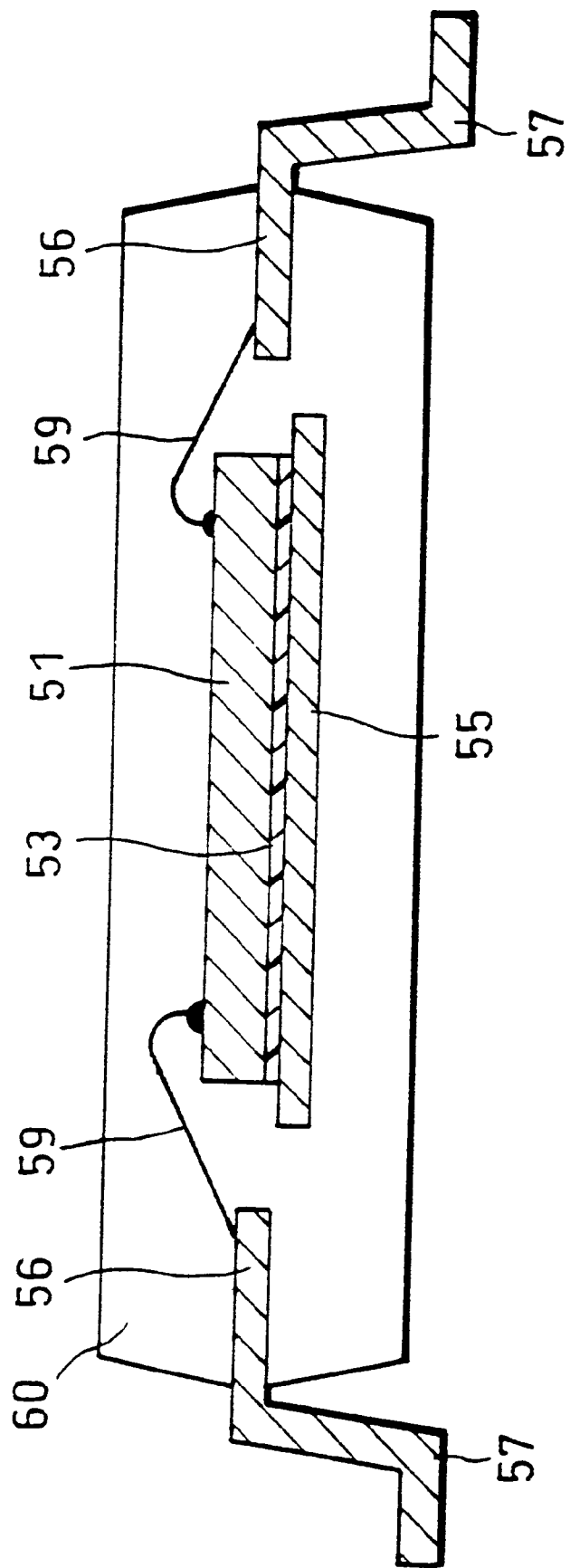
FIG. 9 is a cross-sectional view of the semiconductor device of FIG. 8.
Figure 10:
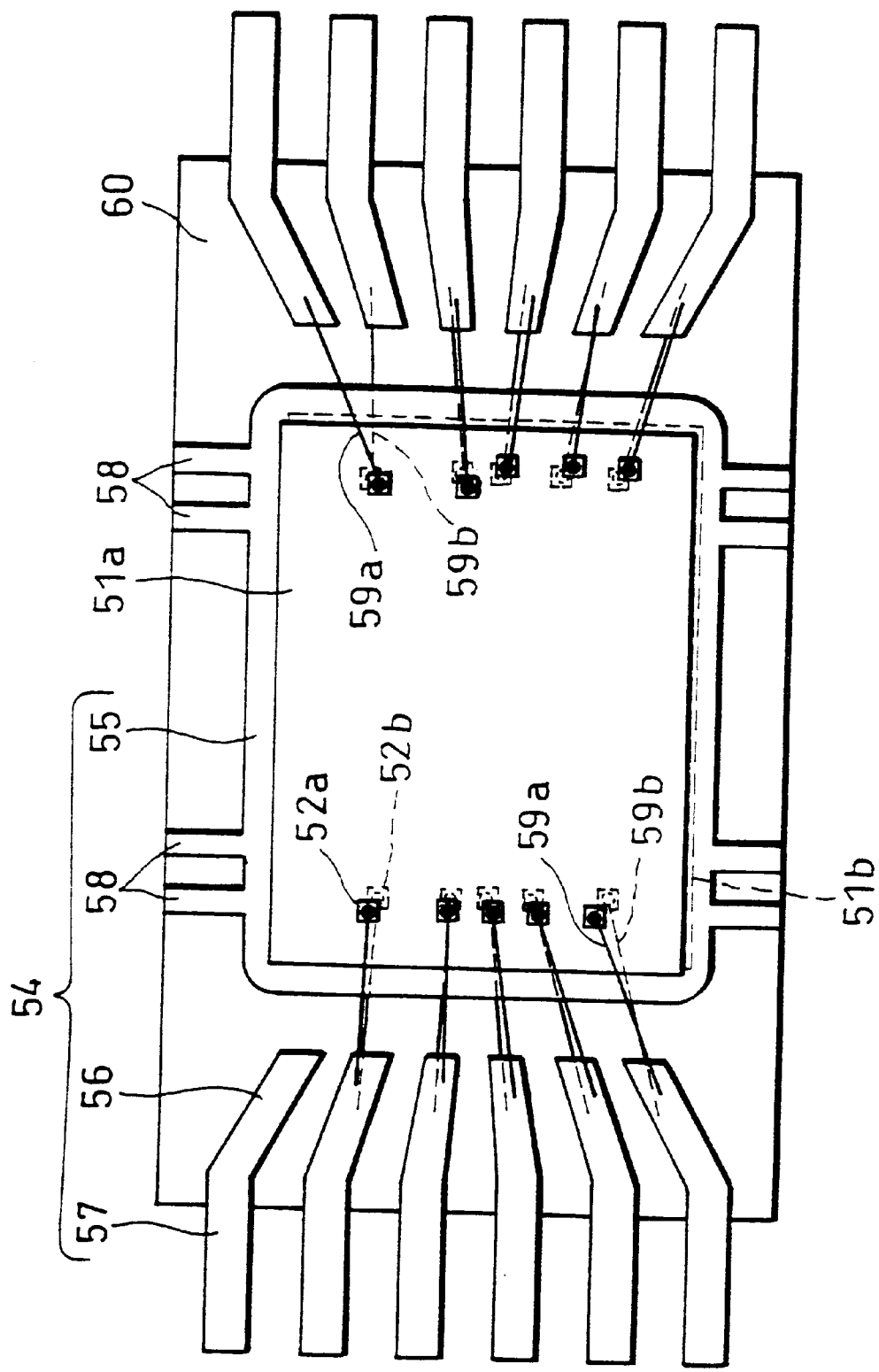
FIG. 10 is a plan view of a conventional 2-chip 1-package semiconductor device.
Figure 11:
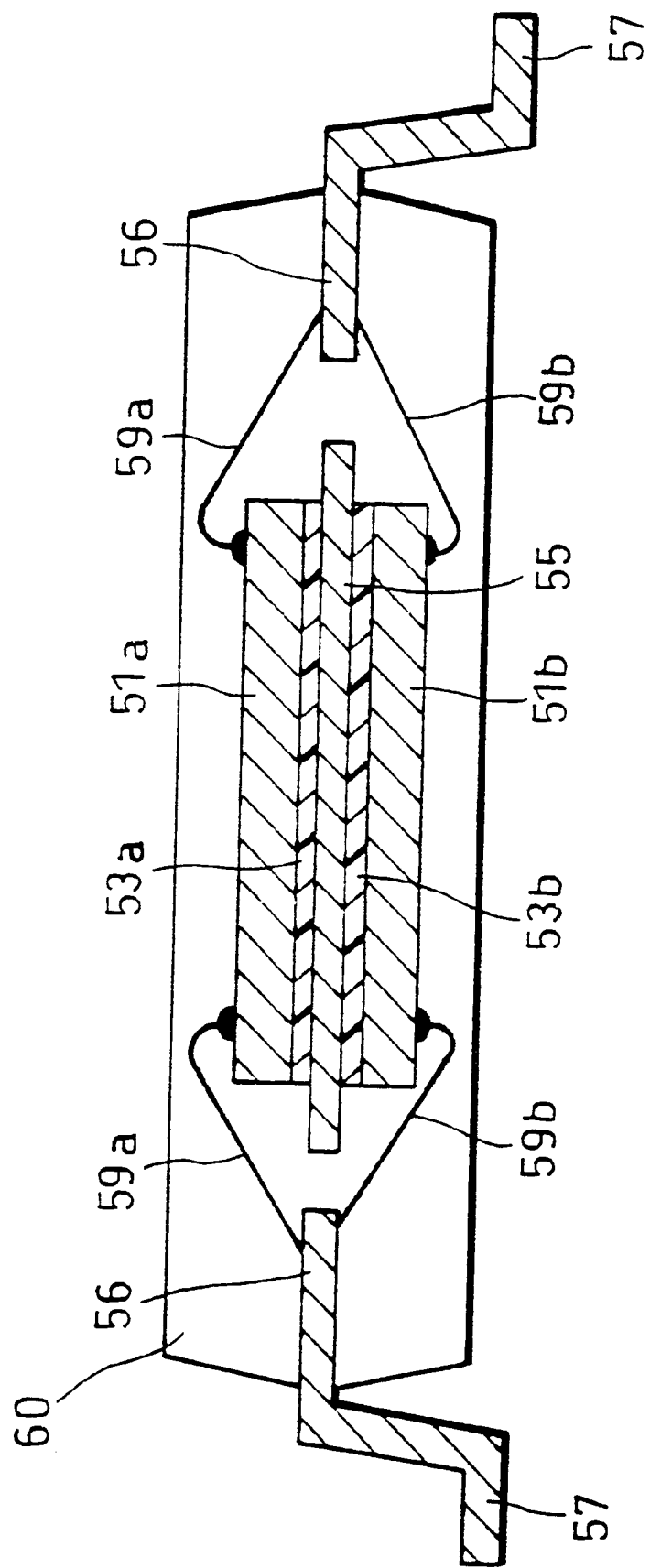
FIG. 11 is a cross-sectional view of the semiconductor device of FIG. 10.

A still another embodiment of the present invention will be explained with reference to FIG. 6 and FIG. 7. The structures having the same functions as in Embodiment 1 will be designated by the same reference numerals and their descriptions will be omitted here.

In the present embodiment, the support leads 8 and the inner leads 6 of the semiconductor device adopted in EMBODIMENT 1 or EMBODIMENT 2 are fixed via a bonding sheet 17 (fixing member) for use in fixing the support leads 8.

The bonding sheet 17 is, for example, arranged such that thermosetting polyimide resin layer (bonding layer) is formed on a polyimide material, and the bonding material layer side thereof is bonded to one side of the inner lead 6 by a thermal compression or subsequent heat treatment.

With the described arrangement, when injecting the sealing resin 11, the displacement in the thickness direction of the die pad 5 supported by the support lead 8 can be more surely suppressed. In practice, the amount of displacement of the die pad 5 that occurred when injecting the sealing resin 11 through the injecting position A can be still reduced compared with the arrangement of embodiment 1. Therefore, the aforementioned effects as achieved from embodiment 1 or 2 can be more surely obtained.

In the present embodiment, in order to improve the flow rate of the sealing resin 11, a recessed portion 5a is formed so that the sealing resin 11 does not flow in the area where the semiconductor chips 1a and 1b are mounted. As a result, the sealing resin 11 to be injected into the resin sealing mold 15 is penetrated entirely inside the mold via the recessed portion 5a, and the problem wherein the void generated when injecting the sealing resin 11 remains in the blind spot can be suppressed. Therefore, a more reliable and stable semiconductor device can be achieved.

Additionally, as the sealing resin 11 penetrates entirely inside the mold via the recessed portion 5a, the die pad 5 and the sealing resin 11 can be surely bonded even when adopting the die pad 5 made of a metal having a low adhesiveness with the sealing resin 11 such as 42 alloy frame, etc. As a result, the problems which may occur when mounting the semiconductor device on a circuit board such as the die pad 5 and the sealing resin 11 becoming separated, which may even cause a crack, can be suppressed.

As described, it is preferable that each of the described methods further includes the step of fixing support leads 8 for supporting the die pad 5 and inner leads 6 to which electrode pads 2a of the semiconductor chips 1a and 1b are electrically connected.

According to the described method, when injecting the sealing resin, the support leads 8 and the inner leads 6 are fixed, and the deviation in the thickness direction of the die pad 5 to be supported by the support leads 8 can be more surely suppressed.

It is preferable that each of the described methods further includes the step of forming a recessed portion 5a which is cut towards an inside of the die pad 5 on a part of the die pad 5 outside a semiconductor chip mounting area.

According to the described method, since the recessed portion 5a is formed at a part of the die pad 5 outside the semiconductor chip mounting area, the sealing resin 11 can be injected in the die pad 5 inside the resin sealing mold 15 via the recessed portion 5a with ease. Namely, by forming the recessed portion 5a, the sealing resin 11 can be injected, for example, to the blind spot of the injection gate 13. As a result, a problem wherein voids remain in the blind spot of the injecting gate can be prevented, thereby providing a more reliable and more stable semiconductor device.

The first semiconductor device in accordance with the present invention includes semiconductor chips having different element forming face areas mounted on respective surfaces of a semiconductor chip mounting use substrate of a lead frame. The lead frame is set in a resin sealing mold having at least an injection gate for injecting the sealing resin therethrough. At least a semiconductor chip having a smaller element forming face area is mounted in more close proximity to the injection gate than the center of the front or rear surface of the semiconductor chip mounting substrate.

In the described arrangement, the semiconductor chips are mounted on the respective surfaces of the semiconductor chip mounting substrate, and these semiconductor chips are sealed with the resin, thereby forming the semiconductor device.

According to the described arrangement, at least the semiconductor chip having a smaller element forming face area is mounted in more close proximity to the injection gate of the resin sealing mold than the center of the front or rear surface of the semiconductor chip mounting substrate. Therefore, when setting the lead frame in the resin sealing mold to be sealed with resin, a deviation in the stress to be applied on both surfaces of the semiconductor chip mounting substrate can be reduced. As a result, the displacement of the semiconductor chip mounting substrate in the thickness direction can be suppressed.

Therefore, when sealing with resin the semiconductor chips having different element forming face areas mounted on respective surfaces of the semiconductor chip mounting substrate, a problem wherein, for example, the semiconductor chip is exposed to the outside of the package due to the deviation of the semiconductor chip mounting substrate can be avoided. As a result, a drop in yield of the device can be avoided, and a quality 2-chip 1-package semiconductor device can be obtained even if a combination of chips of different sizes are adopted to be mounted on respective surfaces of the semiconductor mounting substrate.

The second semiconductor device in accordance with the present invention includes the arrangement of the first semiconductor device. Respective semiconductor chips are mounted in such a manner that at least one of the four side faces of one semiconductor chip is positioned so as to oppose any of the four side faces of the other semiconductor chip.

According to the described arrangement, the respective semiconductor chips are mounted so that at least one of the four side faces of one semiconductor chip is positioned so as to oppose the corresponding side face of the other semiconductor chip via the semiconductor mounting substrate. Therefore, a deviation in the stress applied to respective surfaces of the semiconductor chip mounting use substrate in a vicinity of the injecting gate can be still reduced, and the displacement of the semiconductor chip mounting use substrate in the thickness direction can be further reduced compared with the arrangement of the first semiconductor device. As a result, the effects achieved from the arrangement of the first semiconductor device can be more surely achieved.

The third semiconductor device in accordance with the present invention has the arrangement of the first or second semiconductor device and is arranged such that the flow balancing member for balancing the flow rate of the sealing resin is formed at least in a part of the periphery of the semiconductor chip having a smaller element forming face area mounted on the front or rear surface of the semiconductor chip mounting use substrate so that the flow rate of the sealing resin in the vicinity of one semiconductor chip becomes substantially equivalent to the flow rate of the sealing resin in a vicinity of the other semiconductor chip.

According to the described arrangement, by providing the flow balancing member in the part of the periphery of the semiconductor chip having a smaller element forming face area, the flow rate (volume) of the sealing resin in a vicinity of one semiconductor chip becomes substantially equivalent to the flow rate (volume) of the other semiconductor chip. As a result, in the process of sealing with the resin, the displacement of the semiconductor chip mounting use substrate in the thickness direction caused by the off-balance flow rate can be suppressed. Therefore, according to the described arrangement, the effects as achieved from the arrangement of the first or second semiconductor device can be more surely achieved.

The electrode pads of each semiconductor chip are electrically connected to the inner leads of the lead frame by bonding wires such as gold wires, etc. Especially, in the case of mounting the semiconductor chip having a smaller element forming face area, the bonding wires become relatively long. As a result, the bonding wires may contact the edge portion of the semiconductor chip or the semiconductor chip mounting substrate, which causes a short circuit.

However, according to the described arrangement, the flow balancing member is constituted, for example, by an insulating member, and the bonding wires can be provided along the periphery of the semiconductor chip so that the bonding wires do not contact the edge portion of the semiconductor chip or the semiconductor chip mounting substrate. Therefore, a drop in yield of the device due to the short circuit can be surely prevented.

The fourth semiconductor device in accordance with the present invention includes semiconductor chips having different element forming face areas mounted on respective surfaces of the semiconductor chip mounting substrate of a lead frame. The lead frame is set in the resin sealing mold having at least an injection gate for injecting therethrough the sealing resin to seal each semiconductor chip with resin. The flow balancing member for balancing the flow rate of the sealing resin is provided at part of the periphery of the semiconductor chip having a smaller element forming face area mounted on the front or rear surface of the semiconductor chip mounting substrate such that the flow rate of the sealing resin in a vicinity of one semiconductor chip becomes substantially equivalent to the flow rate of the sealing resin in the vicinity of the other semiconductor chip.

According to the described arrangement, the semiconductor chips are mounted on respective surfaces of the semiconductor chip mounting substrate, and the semiconductor chips are sealed with resin, thereby forming a semiconductor device.

By providing the flow balancing member at least in the part of the periphery of the semiconductor chip having a smaller element forming face area, the flow rate (volume) of the sealing resin in a vicinity of one semiconductor chip becomes substantially equivalent to the flow rate of the sealing resin in a vicinity of the other semiconductor chip. As a result, in the process of sealing with the resin, a problem wherein the semiconductor chip mounting substrate becomes off-balance and displaced in the thickness direction can be suppressed.

Therefore, even in the case where the semiconductor chips having different element forming face areas are mounted on respective surfaces of the semiconductor chip mounting substrate to be sealed with the resin, for example, a problem wherein the semiconductor chip is displaced to be exposed to the outside of the package can be prevented. As a result, a drop in yield of the device can be surely prevented, and a quality 2-chip 1-package semiconductor device can be obtained even when chips having different sizes are combined.

The fifth semiconductor device in accordance with the present invention having the arrangements of the first through fourth semiconductor devices includes a fixing member provided for fixing the support leads for supporting the semiconductor chip mounting use substrate to the inner leads to which the electrode pads of the semiconductor chip are electrically connected respectively.

According to the described arrangement, the support leads and the inner leads are fixed via the fixing member. As a result, when injecting the sealing resin, the displacement of the semiconductor chip mounting substrate in the thickness direction of the semiconductor mounting substrate to be supported by the support leads can be surely suppressed. As a result, the effects as achieved from any of the first through fourth semiconductor devices can be more surely obtained.

The sixth semiconductor device of the present invention having the arrangement of the first through fifth semiconductor devices includes a recessed portion which is cut to the inside of the semiconductor chip mounting substrate and is formed in the part of the semiconductor chip mounted on the semiconductor chip mounting substrate outside the semiconductor chip mounting area.

According to the described arrangement, the recessed portion is formed on the semiconductor chip mounting substrate outside the semiconductor chip mounting area. As a result, the sealing resin to be injected in the resin sealing mold is penetrated into the inside of the resin sealing mold via the recessed portion with ease. Namely, by providing the recessed portion, the sealing resin is injected, for example, to the blind spot of the injection gate. As a result, a problem wherein the voids remain in the blind spot of the injecting gate can be prevented, thereby providing a more reliable and more stable semiconductor device.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:

a semiconductor chip mounting substrate of a lead frame; and first and second semiconductor chips only mounted on respective surfaces of said semiconductor chip mounting substrate, the first semiconductor chip having a larger element forming face area than an element forming face area of the second semiconductor chip, wherein both said first and second semiconductor chips are sealed with resin, and wherein the second semiconductor chip is offset from a center of said semiconductor chip mounting substrate such that one side face thereof is disposed closer to a side of the semiconductor device than an opposite side face thereof.

2. A semiconductor device comprising:

a semiconductor chip only mounting substrate of a lead frame;

first and second semiconductor chips mounted on respective surfaces of said semiconductor chip mounting substrate, the first semiconductor chip having a larger element forming face area than an element forming face area of the second semiconductor chip; and a flow balancing member formed adjacent at least one side face of said second semiconductor chip such that an outer shape of said second semiconductor chip and said flow balancing member is substantially equivalent to an outer shape of said first semiconductor chip, said flow balancing member balancing a sealing resin flow rate when injecting the sealing resin so that a flow rate of the sealing resin in a vicinity of said first semiconductor chip becomes substantially equivalent to a flow rate of the sealing resin in a vicinity of said second semiconductor chip, wherein both said first and second semiconductor chips are sealed with the resin.

3. A semiconductor device comprising:

a semiconductor chip mounting substrate of a lead frame;

a plurality of semiconductor chips having different element forming face areas on respective surfaces of said semiconductor chip mounting substrate, wherein at least one of the semiconductor chips having a smaller element forming face area is mounted offset from a center of the semiconductor chip mounting substrate with one side face thereof in more close proximity to a side of the semiconductor device than an opposite side face thereof, and wherein all the semiconductor chips are sealed with the sealing resin; and a flow balancing member balancing a flow rate of the sealing resin and formed at least in a part of a periphery of a semiconductor chip having a smaller element forming face area mounted on the front or rear surface of said semiconductor mounting substrate so that a flow rate of the sealing resin in a vicinity of one semiconductor chip becomes substantially equivalent to a flow rate of the sealing resin in a vicinity of the other semiconductor chip, said flow balancing member being distinct from said plurality of semiconductor chips.

4. A semiconductor device comprising:

a semiconductor chip mounting substrate of a lead frame; and a plurality of semiconductor chips having different element forming face areas on respective surfaces of said semiconductor chip mounting substrate, wherein at least one of the semiconductor chips having a smaller element forming face area is mounted offset from a center of the semiconductor chip mounting substrate with one side face thereof in more close proximity to a side of the semiconductor device than an opposite side face thereof, and wherein all the semiconductor chips are sealed with the sealing resin, wherein at least one of four side faces of one of the semiconductor chips is positioned so as to substantially oppose a corresponding one of four sides of the other semiconductor chips via said semiconductor chip mounting substrate.

5. A semiconductor device comprising:

a semiconductor chip mounting substrate of a lead frame;

a plurality of semiconductor chips having different element forming face areas on respective surfaces of said semiconductor chip mounting substrate; and a flow balancing member formed at least in a part of a periphery of a semiconductor chip having a smaller element forming face area and distinct from said plurality of semiconductor chips, said flow balancing member balancing a flow rate of sealing resin so that the flow rate of the sealing resin in a vicinity of one semiconductor chip becomes substantially equivalent to a flow rate of the sealing resin in a vicinity of the other semiconductor chip, wherein all the semiconductor chips are sealed with the sealing resin.

6. The semiconductor device as set forth in claim 3, further comprising a fixing member that fixes support leads for supporting the semiconductor chip mounting substrate and inner leads to which electrode pads of the semiconductor chips are electrically connected respectively.

7. The semiconductor device as set forth in claim 5, further comprising a fixing member that fixes support leads for supporting the semiconductor chip mounting substrate and inner leads to which electrode pads of the semiconductor chips are electrically connected respectively.

8. The semiconductor device as set forth in claim 3, wherein:

a recessed portion which is cut towards an inside of the semiconductor chip mounting substrate is formed in a part of a periphery of said semiconductor mounting use substrate outside a semiconductor chip mounting area.

9. The semiconductor device as set forth in claim 5, wherein:

a recessed portion which is cut towards an inside of the semiconductor chip mounting substrate is formed in a part of a periphery of said semiconductor mounting use substrate outside a semiconductor chip mounting area.

10. The semiconductor device as recited in claim 3, wherein:

an overall outer shape of said semiconductor chip having a smaller element forming face area and said flow balancing member is substantially equivalent to an outer shape of said semiconductor chip having a larger element forming face area.

11. A semiconductor device comprising:

a semiconductor chip mounting substrate of a lead frame, said semiconductor chip mounting substrate having a first mounting surface and a second mounting surface;

a first semiconductor chip having an element forming face area, said first semiconductor chip being mounted on said first surface of said semiconductor chip mounting substrate; and a second semiconductor chip having an element forming face area different from the first semiconductor chip, said second semiconductor chip being mounted on said second surface of said semiconductor chip mounting substrate, wherein side surfaces of said first semiconductor chip and said second semiconductor chip on one side of the semiconductor device are substantially aligned, wherein said first semiconductor chip and said second semiconductor chip are the only semiconductor chips of the device.

12. The semiconductor device as set forth in claim 11, further comprising a flow balancing member balancing a flow rate of sealing resin, said flow balancing member being formed at least in a part of a periphery of one of the first semiconductor chip and the second semiconductor chip having a smaller element forming face area such that a flow rate of the sealing resin in a vicinity of one semiconductor chip becomes substantially equivalent to a flow rate of the sealing resin in a vicinity of the other semiconductor chip.

* * * * *